United States Patent [19]
Krumm

[11] Patent Number: 5,457,399
[45] Date of Patent: Oct. 10, 1995

[54] MICROWAVE MONOLITHIC INTEGRATED CIRCUIT FABRICATION, TEST METHOD AND TEST PROBES

[75] Inventor: Charles F. Krumm, Thousand Oaks, Calif.

[73] Assignee: Hughes Aircraft Company, Los Angeles, Calif.

[21] Appl. No.: 993,767

[22] Filed: Dec. 14, 1992

[51] Int. Cl.⁶ .................................................. H01L 21/66
[52] U.S. Cl. ................................. 324/758; 437/8; 437/7; 364/490; 364/491
[58] Field of Search ........................... 324/73 R, 158 R, 324/754, 758, 757; 148/DIG. 162; 437/8

[56] References Cited

U.S. PATENT DOCUMENTS

| | | | |
|---|---|---|---|
| 4,801,867 | 1/1989 | Suzuki | 324/73 |
| 5,051,373 | 9/1991 | Yamada et al. | 437/8 |

FOREIGN PATENT DOCUMENTS

| | | | |
|---|---|---|---|
| 62-190750 | 8/1987 | Japan | 437/8 |
| 4184955 | 6/1992 | Japan | 437/8 |
| 2090057 | 6/1982 | United Kingdom | 437/8 |

*Primary Examiner*—Kenneth A. Wieder
*Assistant Examiner*—Barry C. Bowser
*Attorney, Agent, or Firm*—Leonard A. Alkov; W. K. Denson-Low

[57] ABSTRACT

The present invention performs RF performance measurements on basic transistors of a microwave monolithic integrated circuit while it is being fabricated. The circuitry necessary to assess the performance potential at the frequency and power levels of interest is provided by incorporating matching elements onto RF probes used for in-process tests. This invention measures the RF performance potential of GaAs monolithic microwave integrated circuits at an early stage in the process before expensive process sequence has been completed. The essence of the invention is that the transistors are measured with an RF probe that has RF matching circuitry included as an integral part of the probe. Consequently, the performance potential of circuits on the wafer is assessed at the earliest possible point in the manufacturing process; specifically as soon as Schottky barrier gates have been deposited. This in-process measurement approach may be applied to any microwave monolithic integrated circuit. Once the correlation between in-process and post-process measurement results are established, the present method may be used to routinely screen wafers, thereby saving roughly two-thirds of the processing costs of "RF bad" wafers.

15 Claims, 3 Drawing Sheets

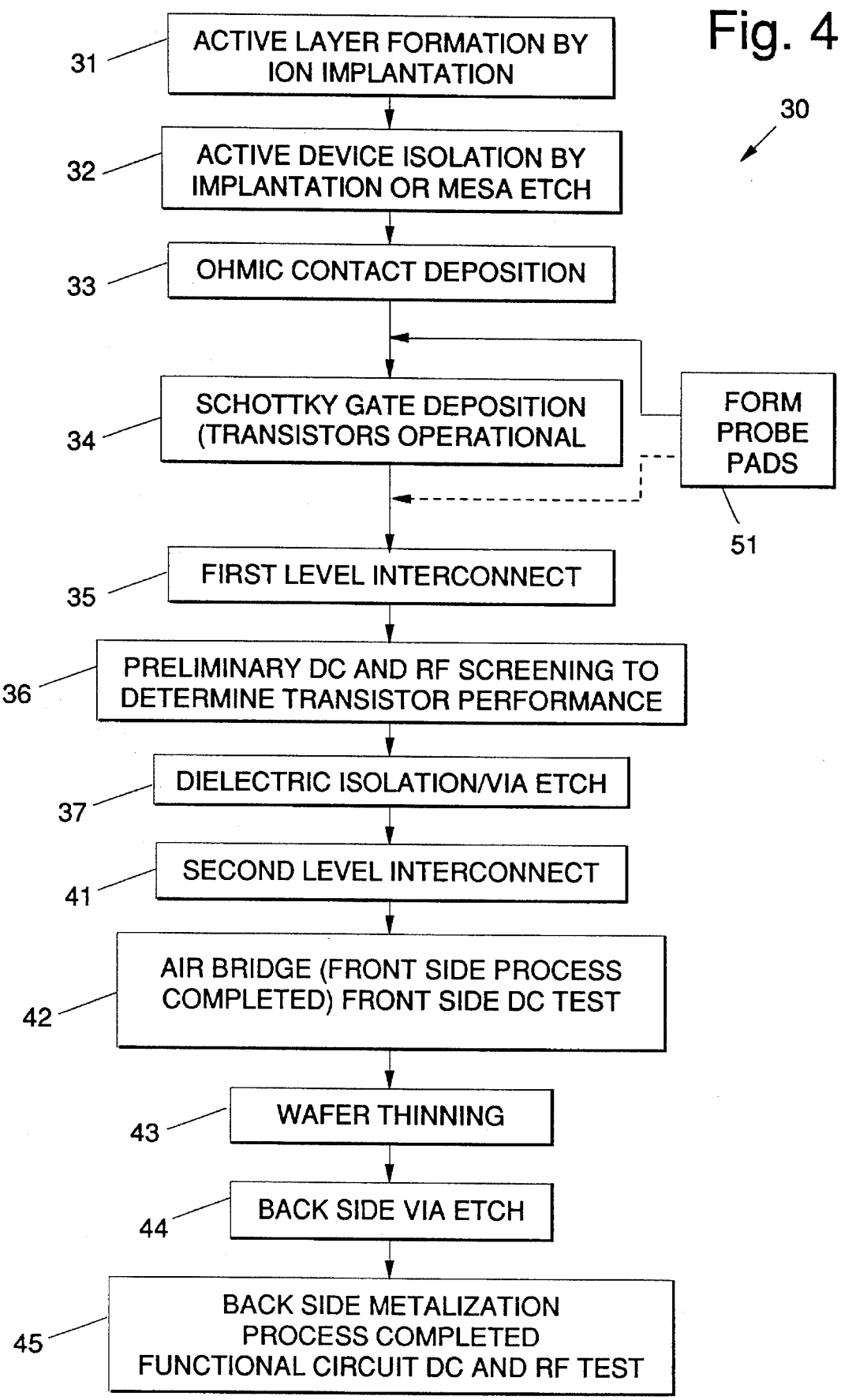

& nbsp;
MICROWAVE MONOLITHIC INTEGRATED CIRCUIT FABRICATION, TEST METHOD AND TEST PROBES Government Rights This invention was made with Government support under Contract No. F33615-88-C-1741 awarded by the Department of the Air Force. The Government has certain rights in this invention.

BACKGROUND

The present invention relates generally to microwave monolithic integrated circuits, and more particularly, to a microwave monolithic integrated circuit fabrication and test method and test circuits that determine the performance potential of the circuits during the manufacturing process.

Currently, the cost to produce a GaAs microwave monolithic integrated circuits is $5,000 to $10,000 per wafer. However, not all completed circuits produce acceptable RF performance. Transistors are RF testable as soon as the basic transistor structure is completed, which is 30–40% of the way through the manufacturing process. Currently RF tests are performed on completed wafers. The conventional method for testing completed wafers is to evaluate completed microwave monolithic integrated circuits using on-wafer RF probes coupled to a 50 ohm measurement system.

Two methods are commonly used to assess performance potential of microwave monolithic integrated circuit wafers. DC tests can be performed early in the process sequence (at the same point as the present invention implements RF tests). However, the correlation between the DC tests and RF results is not good. Therefore, the risk of rejecting "RF good wafers" or processing "RF bad" wafers based solely on DC test results is high. An alternative is to perform tests after completion of wafer processing. The problem with this approach is that significant value has been added to wafers that could have been tested earlier and found to be "RF bad". Any funds expended on wafers known (or even unknown) to be "RF bad" are wasted since the wafer costs are unrecoverable after processing is completed.

The current approaches to assessing performance potential early in the process sequence have been to take DC measurements of transistor current-voltage characteristics. Unfortunately, the correlation between these measurements and the RF performance of the completed circuits is relatively poor at this stage of the technology evolution. An alternative technique which has been proposed is to measure the circuit performance at some frequency well below its intended operating frequency; for example, 2 GHz for a circuit intended for 10 GHz operation. Again, the correlation between low frequency test results and higher frequency performance is not as good as desired.

Therefore, it is desirable to measure the performance potential of a wafer as soon as possible in the process so that "RF bad" wafers are not processed to completion. A significant savings would result if the performance potential of microwave monolithic integrated circuits could be assessed early in the manufacturing process.

SUMMARY OF THE INVENTION

In order to eliminate the waste inherent in processing microwave monolithic integrated circuits to completion and then testing them for RF capabilities, in the present invention, the RF performance measurements are performed on the basic transistors which comprise the microwave monolithic integrated circuits. The circuitry necessary to assess the performance potential at the frequency and power levels of interest is provided by incorporating matching elements onto the on-wafer RF probes used for in-process tests.

The present invention measures the RF performance potential of GaAs monolithic microwave integrated circuits at an early stage in the process before the expensive process sequence has been completed. The essence of the invention is that the transistors formed at wafer test sites are measured with an RF probe having RF matching circuitry included as an integral part of the probe. Consequently, the performance potential of circuits on the wafer is assessed at the earliest possible point in the manufacturing process; specifically at the time Schottky barrier gates, for example, are deposited.

This in-process measurement approach may be applied to any microwave monolithic integrated circuit. Once the correlation between in-process and post-process measurement results are established, the present method may be used to routinely screen wafers, thereby saving roughly two-thirds of the processing cost of "RF bad" wafers.

Thus, to summarize the present invention, it is a GaAs microwave monolithic integrated circuit fabrication and test method comprising the following steps. Fabricating a plurality of GaAs microwave monolithic integrated circuits, including a plurality of test transistors, such that active layers, interconnect layers, contacts, and gates are formed, which integrated circuits and test transistors comprise operational transistors. Performing DC and RF testing of the test transistors to determine operability of the operational transistors. If the test transistors are operable and perform in a proper manner, then completing fabrication of the plurality of GaAs microwave monolithic integrated circuits.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIG. 4 shows a typical GaAs microwave monolithic integrated circuits process sequence in accordance with the principles of the present invention.

DETAILED DESCRIPTION

Figure 1:
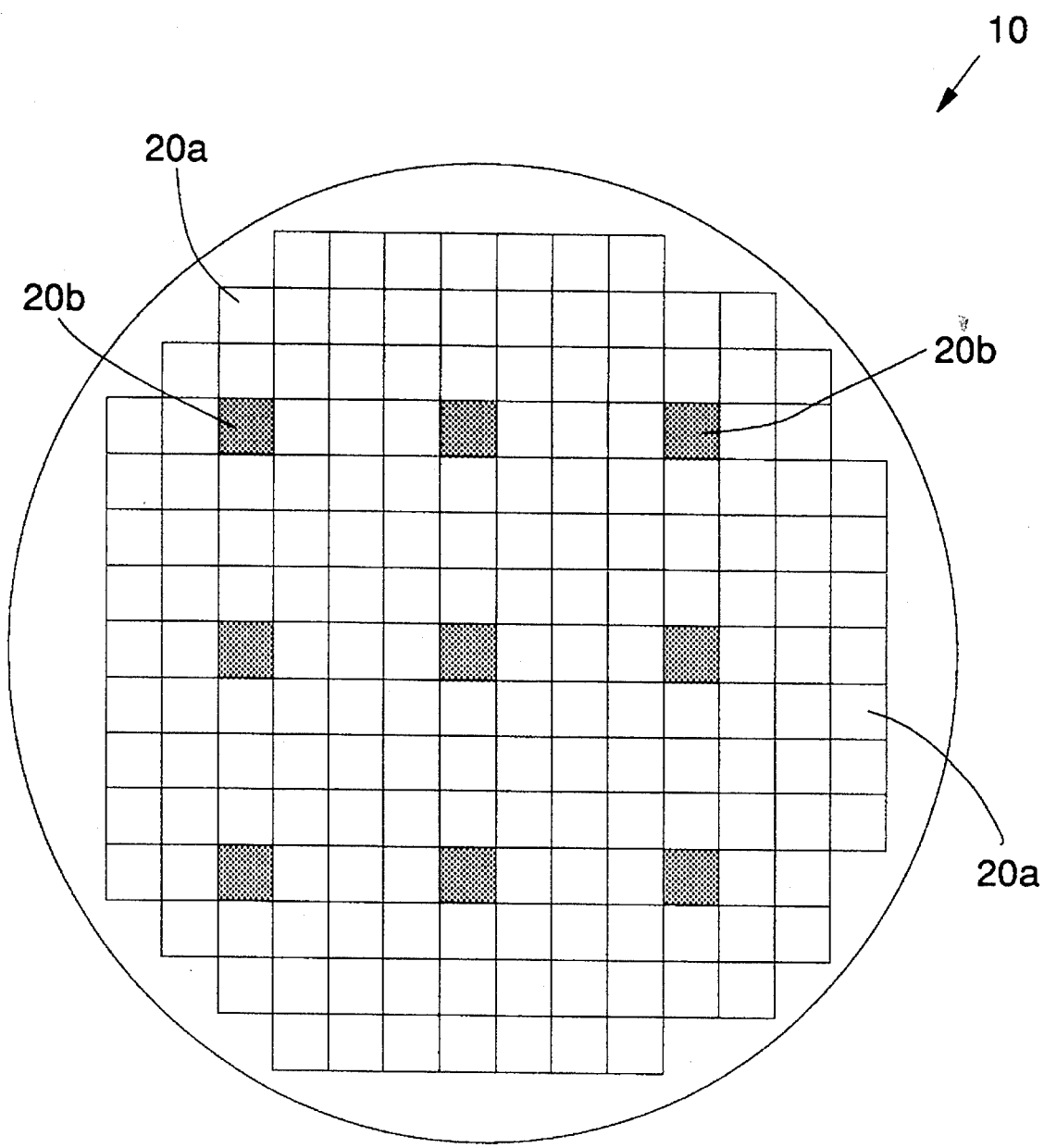
FIG. 1 illustrates a typical GaAs wafer incorporating monolithic microwave integrated circuits and test site location containing transistors for RF on-wafer probing in accordance with the principles of the present invention.

Referring to the drawing figures, FIG. 1 illustrates a typical GaAs wafer 10 incorporating monolithic microwave integrated circuits 20a, and test site locations 20b containing transistors 11 for RF on-wafer probing in accordance with the principles of the present invention. More particularly, the wafer 10 is shown having two types of integrated circuit areas. The blank areas represent monolithic microwave integrated circuits 20a. The shaded areas represent process control monitor sites, comprising the test site locations 20b, that include as one element among many, a coplanar transistor 11, for example, as is shown in FIG. 2.

Figure 2:
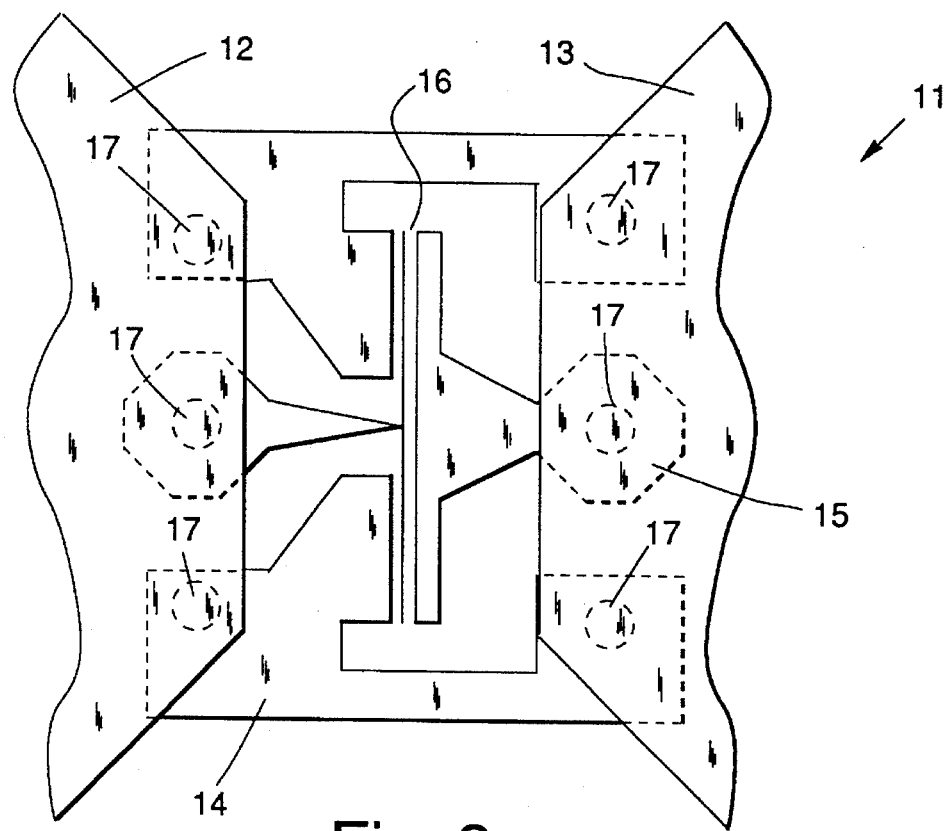
FIG. 2 shows a coplanar transistor and probes designed for probe-matched, on-wafer testing in accordance with the principles of the present invention.
Figure 3:
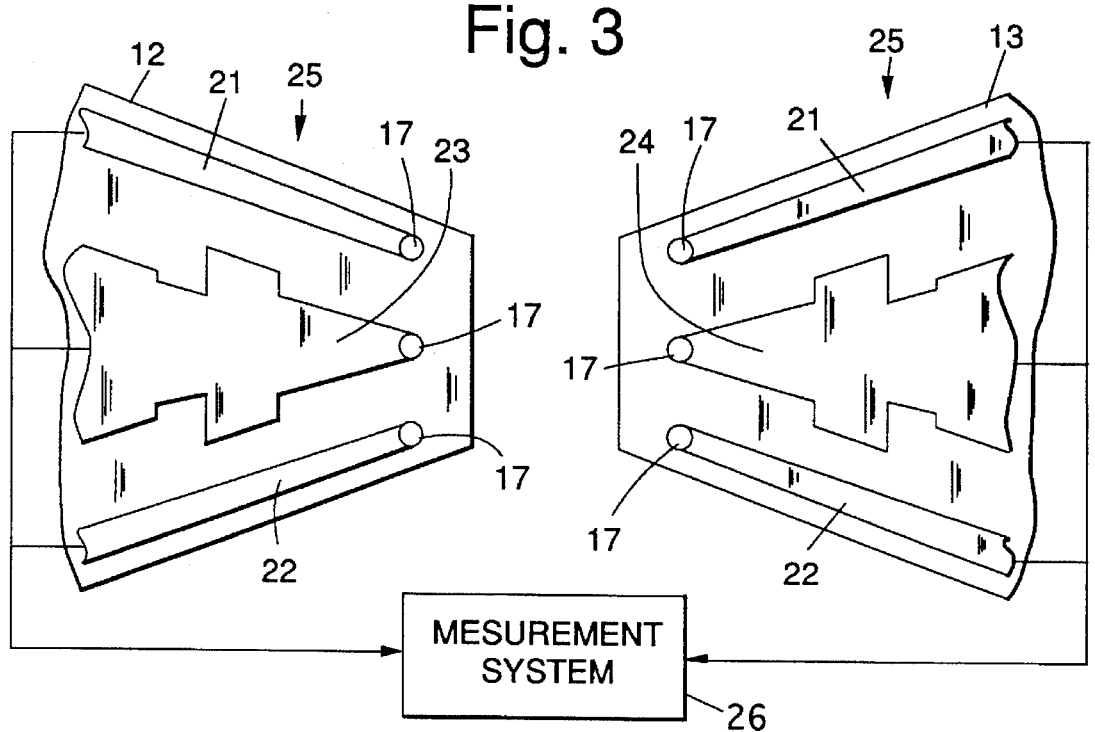
FIG. 3 shows RF probes with impedance matching circuitry appropriate for probe-matched, on-wafer testing in accordance with the principles of the present invention.

FIG. 2 shows the coplanar transistor 11 which is part of a GaAs microwave monolithic integrated circuit test pattern located at the test site locations or reticles 20b, and which is repeated periodically across a GaAs monolithic integrated circuit wafer 10. Probes 12, 13 are shown disposed above the wafer 10 that are designed for on-wafer testing in accordance with the principles of the present invention. FIG. 2 shows a top view of the test site location 20b looking at the top surface of the transistor 11, and wherein the probes 12, 13 overlay the surface of the transistor 11. Probe contact pads 17 are disposed in contact with the corresponding pad areas of the transistor 11 during the DC and RF measurement sequence. FIG. 3 shows the details of the RF probes 12, 13 showing impedance matching circuitry 23, 24 appropriate for probe-matched, on-wafer testing in accordance with the principles of the present invention. More particularly, FIG. 3 shows an underside view of the probes 12, 13 illustrating the details of the impedance matching circuitry 23, 24.

More particularly, and with reference to FIG. 2, the coplanar transistor 11 is typically a Schottky barrier field effect transistor 11, for example, that is comprised of a source 14, a drain 15, and a gate 16. Overlaying the transistor 11 are the two RF probes 12, 13 that each have three probe contacts 17. The probe contacts 17 are shown in phantom since they are on the bottom surface of the probes 12, 13. Each of the three probe contacts are sized and spaced so that they contact the source 14, drain 15 and gate 16. With reference to FIG. 3, the outermost probe contacts 17 of each RF probe 12, 13 provide RF and DC ground connections by way of two conductors 21, 22, while the respective central probe contacts 17 provide RF signal and DC bias connections through input and output impedance matching circuitry 23, 24 that is disposed on the underside of the probes 12, 13.

The coplanar transistor 11 of FIG. 2 is designed for probe-matched, on-wafer testing in accordance with the principles of the present invention. This transistor 11 is RF performance evaluated after Schottky gate or first interconnect metal deposition, as will be described below with reference to FIG. 4. This testing is performed much earlier in the manufacturing process than is conventionally possible, thereby saving the cost of processing wafers 10 that do not meet RF performance standards.

The RF probes 12, 13 shown in FIG. 3 incorporate input and output impedance matching circuitry 23, 24 that is appropriate for probe-matched, on-wafer testing in accordance with the principles of the present invention. RF probes 12, 13, such as those manufactured by Cascade Microtech, of Beaverton, Oreg., for example, have been adapted to include impedance matching circuitry 23, 24 appropriate for the frequency band and signal level of interest, and are imprinted using a coplanar transmission line impedance matching probe structure 25. The impedance matching probe structure 25 forms a microwave transition between the planar transistor 11 and a 50 ohm measurement system 26 that typically employs coaxial microwave terminals.

The term GaAs microwave monolithic integrated circuit 20a as used herein is any circuit, whether it is manufactured in silicon or gallium arsenide or related compound semiconductor material, that performs what is normally considered to be a microwave function. Likewise, the term Schottky barrier field effect transistor 11 used to describe the microwave function evaluated according to the principles of the present invention may be any type of passive or active microwave function including field effect transistors, bipolar transistors, metal oxide field effect transistors or two terminal microwave devices such as PIN diodes, IMPATT diodes or Gunn diodes, for example. Furthermore, the coplanar transmission line structures referred to herein represent any type of RF transmission lines including coplanar and microstrip transmission lines, and the like, for example.

FIG. 4 shows a representative process sequence 30 or method 30 in accordance with the principles of the present invention that is adapted for use in testing the GaAs microwave monolithic integrated circuit wafer 10. The method 30 shown in FIG. 4 also identifies test points at which time the integrated circuit wafer 10 is tested. Such a GaAs microwave monolithic integrated circuit wafer 10 is tested with the transistors 11 and impedance matching probes 12, 13 shown and described with reference to FIGS. 2 and 3. Typical impedance matching probes 12, 13 that may be adapted for use in the present method 30 are manufactured by Cascade Microtech of Beaverton, Oreg.

The Cascade Microtech probes 12, 13 cited herein are typical of those used to interface measurement systems with RF monolithic microwave circuits in wafer form. However, other probes, such as membrane probes that serve the same purpose and may be adapted to implement the same impedance matching functions described above, and may be employed in accordance with the teachings of the present invention. Accordingly, such membrane probes are represented by the Cascade probes described herein.

GaAs microwave monolithic integrated circuit production yield is conventionally quite low due to the immaturity of the fabrication process. In the production process, the transistors 11 that form the active devices in the GaAs microwave monolithic integrated circuit 20a are completed relatively early in the production sequence, at about 30–40% of the way through the overall process sequence. However, RF matching circuitry necessary to test these circuits 20a as multi-stage amplifiers is not completed until the last step of the production sequence. Consequently, significant savings in development and production costs is achieved in accordance with the method 30 of the present invention by determining the performance potential of the circuits 20a early in the process sequence.

The present invention circumvents most of the problems prevalent in the art by testing the performance of the individual transistors 11 of the circuits 20a as soon as they are fabricated. The circuits 20a are testable as functional transistors as soon as the Schottky barrier gates 16 have been deposited. The present invention thus provides a means for testing the circuits 20a at the earliest possible point in the manufacturing process.

With reference to FIG. 4, it shows the GaAs microwave monolithic integrated circuit process sequence 30 in accordance with the principles of the present invention. This process sequence 30 is one of many that may be employed, and of which the present invention may be incorporated to provide for integrated circuit testing. Also included in FIG. 4 are references to typical test points during the process sequence 30. Clearly it is advantageous to test at the point in the process sequence 30 provided for by the present invention rather than at the very end as is conventionally done. A slight modification to the normal manufacturing process is required and is described below.

The method 30 is as follows. The first step 31 forms active layers on a substrate, by means of ion implantation, for example. The next step 32 isolates active devices (transistors 11) by implantation or mesa etching, for example. Then, ohmic contacts are deposited in step 33. Then, Schottky gates are deposited in step 34, and the transistors 11 are operational. A first level interconnect is then deposited in step 35. Preliminary DC and RF screening in accordance with the present invention is then performed to determine transistor performance in step 36. Dielectric isolation and via etching is then performed in step 37.

Then, second level interconnects are deposited in step 41. Air bridges are then formed in step 42. At this point, front side wafer processing is completed and front side DC testing is performed, also indicated in step 42. Wafer thinning is then performed in step 43. A back side via etch is then performed in step 44. Back side metalization is then deposited in step 45 and back side processing is complete. Functional circuit DC and RF testing is then performed, also indicated in step 45.

In accordance with the present invention, either at the point of ohmic contact or gate level metal deposition, steps 33 or 34, additional pads are added to provide coplanar line transition to the on-wafer probes 12, 13, as is indicated in step 51. Thus, individual transistors 11 that are representative of the performance of the transistors on the wafer 10 are available for RF probing. The transistors 11 are available from the test reticles 20b formed on the wafer 10. The individual transistors 11 are tested at specific frequencies in a specific mode of operation; for example, low noise or large signal, high power. The means for testing in specific modes is provided by the on-wafer matching circuitry 23, 24, which are provided on the probes 12, 13.

Referring again to FIG. 2, the transistor 11 to be tested is shown, while the probes 17 with deposited matching circuitry 23, 24 are shown in FIG. 3. The matching circuitry 23, 24 provides an RF signal environment very near to that which would be obtained with on-wafer printed matching circuitry fabricated in conventional practice. Since the RF environment is much like the actual operating conditions expected from the circuit 20a in its final configuration, the early tests of the transistors 11 achieved by the present invention provide an excellent indication of the performance potential of the devices employed in the microwave monolithic integrated circuit 20a. The matching circuitry 23, 24 provides appropriate impedance levels at appropriate frequency bands and is printed onto the coplanar RF test probes 12, 13. These probes 12, 13 provide the impedance transformation between the conventional 50 ohm measurement system 26 and the transistors 11.

To summarize the probe-matched, on-wafer testing of the present invention, the integrated circuit wafer 10 is processed in a normal manner to fabricate monolithic integrated circuits 20a, 20b thereon. After either gate or first interconnect metal deposition, the transistors 11 disposed at the test site locations 20b are evaluated for RF performance. This is accomplished by placing the probes 12, 13 onto the surface of the transistors 11 and testing the transistors 11 in a conventional manner. If the transistors 11 perform as desired, then the wafer fabrication process is continued and the wafer 10 is processed to completion.

The testing of the transistors 11 on the wafer 10 using the pre-matched probes 17 provides an excellent indication of whether the transistors 11 on the wafer 10 will function as expected. This is an extremely cost-effective method 30 of early evaluation of GaAs microwave monolithic integrated circuits 20a.

Thus there has been described a new and improved microwave monolithic integrated circuit fabrication and test method and test circuits that determine the performance potential of the circuits during the circuit manufacturing process. It is to be understood that the above-described embodiment is merely illustrative of some of the many specific embodiments which represent applications of the principles of the present invention. Clearly, numerous and other arrangements can be readily devised by those skilled in the art without departing from the scope of the invention.

What is claimed is:

1. A GaAs microwave monolithic integrated circuit fabrication and test method comprising the steps of:

fabricating a plurality of GaAs microwave monolithic integrated circuits including a plurality of test transistors, such that active layers, interconnect layers, contacts, and gates are formed, which integrated circuits and test transistors comprise operational transistors;

performing DC and RF testing of the test transistors to determine operability of the operational transistors;

if the test transistors are operable and perform in a predetermined manner, then completing fabrication of the plurality of GaAs microwave monolithic integrated circuits.

2. The method of claim 1 wherein the step of performing DC and RF testing comprises the steps of:

depositing interconnection pads on the surface of the test transistors to provide for coplanar line transitions to probes that are subsequently disposed thereon to performing DC and RF testing.

3. The method of claim 2 which further comprises providing matching circuitry having desired impedance levels at predetermined frequency bands that is coupled to the interconnection pads and which provide an impedance transformation between a measurement system and the microwave monolithic integrated circuit.

4. The method of claim 3 wherein the matching circuitry is incorporated in coplanar RF test probes.

5. The method of claim 3 wherein the matching circuitry is printed onto coplanar RF test probes.

6. The method of claim 3 wherein the measurement system is a 50 ohm measurement system.

7. The method of claim 1 wherein the step of fabricating a plurality of GaAs microwave monolithic integrated circuits including a plurality of test transistors comprises the step of fabricating a plurality of field effect transistors.

8. The method of claim 1 wherein the step of fabricating a plurality of GaAs microwave monolithic integrated circuits including a plurality of test transistors comprises the step of fabricating a plurality of metal oxide field effect transistors.

9. The method of claim 1 wherein the step of fabricating a plurality of GaAs microwave monolithic integrated circuits including a plurality of test transistors comprises the step of fabricating a plurality of bipolar transistors.

10. The method of claim 1 wherein the step of fabricating a plurality of GaAs microwave monolithic integrated circuits including a plurality of test transistors comprises the step of fabricating a plurality of two terminal microwave devices.

11. The method of claim 10 wherein the step of fabricating a plurality of two terminal microwave devices comprises the step of fabricating a plurality of PIN diodes.

12. The method of claim 10 wherein the step of fabricating a plurality of two terminal microwave devices comprises the step of fabricating a plurality of IMPATT diodes.

13. The method of claim 10 wherein the step of fabricating a plurality of two terminal microwave devices comprises the step of fabricating a plurality of Gunn diodes.

14. The method of claim 3 wherein the step of providing matching circuitry having desired impedance levels at predetermined frequency bands comprises the step of providing a coplanar transmission line structure.

15. The method of claim 3 wherein the step of providing matching circuitry having desired impedance levels at predetermined frequency bands comprises the step of providing a microstrip transmission lines.

* * * * *